(12) United States Patent
Maruyama et al.

(10) Patent No.: US 7,405,162 B2
(45) Date of Patent: Jul. 29, 2008

(54) ETCHING METHOD AND COMPUTER-READABLE STORAGE MEDIUM

(75) Inventors: Koji Maruyama, Nirasaki (JP); Yusuke Hirayama, Nirasaki (JP); Nozomi Hirai, Nirasaki (JP); Takanori Mimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/231,979

(22) Filed: Sep. 22, 2005

(65) Prior Publication Data

US 2006/0063385 A1    Mar. 23, 2006

Related U.S. Application Data

(60) Provisional application No. 60/620,718, filed on Oct. 22, 2004.

(30) Foreign Application Priority Data

Sep. 22, 2004    (JP)    ............................. 2004-274637

(51) Int. Cl.
*H01L 21/302* (2006.01)

(52) U.S. Cl. .................. 438/734; 438/701; 438/714; 438/719; 216/67; 216/72; 216/74

(58) Field of Classification Search ................. 700/121; 438/701, 714, 719, 734; 216/67, 72, 74
See application file for complete search history.

(56) References Cited

U.S. PATENT DOCUMENTS

| | | | | | |
|---|---|---|---|---|---|
| 4,560,436 | A | * | 12/1985 | Bukhman et al. | 438/701 |
| 4,980,316 | A | * | 12/1990 | Huebner | 438/577 |
| 6,461,934 | B2 | * | 10/2002 | Nishida et al. | 438/424 |
| 2005/0029221 | A1 | * | 2/2005 | Chang et al. | 216/2 |

* cited by examiner

*Primary Examiner*—George A. Goudreau
(74) *Attorney, Agent, or Firm*—Oblon, Spivak, McClelland, Maier & Neustadt, P.C.

(57) ABSTRACT

An etching method forms an opening with a substantially vertical profile extending to a stopper layer by performing an etching with a plasma of an etching gas acting on an object to be processed loaded in an evacuable processing vessel, wherein the object has a mask layer of a predetermined pattern, a silicon layer to be etched formed below the mask layer and the stopper layer formed below the silicon layer. The etching method includes a first etching process for forming an opening with a tapered wall surface in the silicon layer by using a first etching gas including a fluorine-containing gas and $O_2$ but not HBr; and a second etching process for etching the opening by using a second etching gas including a fluorine-containing gas, $O_2$ and HBr.

10 Claims, 9 Drawing Sheets

CENTRAL PORTION

EDGE PORTION

CENTRAL PORTION

EDGE PORTION

CENTRAL PORTION

EDGE PORTION

CENTRAL PORTION

EDGE PORTION

CENTRAL PORTION

EDGE PORTION

ETCHING METHOD AND COMPUTER-READABLE STORAGE MEDIUM

FIELD OF THE INVENTION

The present invention relates to an etching method; and more particularly, to an etching method for performing an etching on a silicon substrate by using a plasma of a reactive gas.

BACKGROUND OF THE INVENTION

A device of a silicon-on-insulator (SOI) structure is expected to be applicable to micro electro mechanical systems (MEMS) as well as various semiconductor devices such as ultra large scale integrated circuits (LSI), for the device is capable of reducing power consumption, while realizing a high speed operation. In a manufacturing process of a semiconductor device having an SOI structure, a hole or a trench is formed while a silicon (Si) layer formed on a buried oxide (BOX) layer being etched. At this time, a gaseous mixture of $SF_6+O_2$, $SF_6+O_2+SiF_4$, $SF_6+C_4F_8$ or the like is used as an etching gas, and the Si layer is etched until the BOX layer with the SOI structure is exposed.

However, when the etching is progressed down to near the BOX layer, there occurs a notching phenomenon, i.e., the etching of the silicon layer progresses in a horizontal direction at an interface between the Si layer and the hard BOX layer. It is believed that this notching phenomenon is caused because a balance in inflow of positive ions and electrons is broken at a bottom portion of a hole or a trench with a high aspect ratio, thereby resulting in an excessive presence of the ions. The excessive inflow of the positive ions makes the BOX layer be positively charged, which in turn causes the path of the positive ions among the incident plasma to be bent, resulting in the etching of the sidewall of the silicon layer or a protective film therefor.

Moreover, in general, etching rate at a central portion of a substrate to be processed is different from that at an edge portion thereof. Thus, when etching a silicon layer of a substrate having an SOI structure by using the above mentioned gas system, if the etching is performed until the etching on a lower etching rate portion of the silicon layer is completed, a higher etching rate portion thereof will be kept being etched even after the BOX layer is exposed, resulting in an overetching on that portion. As a result, notching is further likely to occur.

As a technique to prevent notching, there is proposed an etching method for performing an etching by mixing an etching gas with an additive gas such as silicon tetrachloride containing an element identical to that constituting a thin film to be etched (see, for example, Japanese Patent Laid-open Publication No. H8-213368, e.g., claim 1: Reference 1).

Further, there is also proposed an etching method which employs $SF_6+HB_r+O_2$ as a first etchant and $HBr+O_2$ as a second etchant to prevent notching (see, for example, U.S. Pat. No. 6,391,788, e.g., claim 1: Reference 2).

In general, in the aspect of improving a throughput, a higher etching rate is preferable and, in case of performing an etching on a substrate to be processed with an SOI structure, it is necessary to conduct the processing at a high etching rate. However, both the above-described conventional etching methods aim at avoiding notching at the expense of the etching rate. For example, in Reference 1, though prevention of notching is attempted by forming a protective film through an addition of silicon tetrachloride, the etching rate decreases inevitably due to the presence of the protective film. Further, in the method disclosed in Reference 2, since a gas containing HBr, which forms deposits readily, is used as a first etchant, its etching rate may be in a range between 2 and 4 μm/min at the most, and an etching rate of a second etchant is also as low as 6000 to 8000 Å/min. Accordingly, although the conventional methods for avoiding notching succeed in preventing notching, they have difficulty in finding practical applications, because their etching rates are excessively low.

SUMMARY OF THE INVENTION

It is, therefore, an object of the present invention, to provide an etching method capable of performing an etching at a high etching rate, while avoiding notching.

In accordance with a first aspect of the present invention, there is provided an etching method for forming an opening with a substantially vertical profile extending to a stopper layer by performing an etching with a plasma of an etching gas acting on an object to be processed loaded in an evacuable processing vessel, wherein the object has a mask layer of a predetermined pattern, a silicon layer to be etched formed below the mask layer and the stopper layer formed below the silicon layer, the method including: a first etching process for forming an opening with a tapered wall surface in the silicon layer by using a first etching gas including a fluorine-containing gas and $O_2$ but not HBr; and a second etching process for etching the opening by using a second etching gas including a fluorine-containing gas, $O_2$ and HBr.

Preferably, the fluorine-containing gas is $SF_6$. Further, in the first etching process, the etching may be performed until a part of the stopper layer is exposed or overetching may be performed for a preset time period after a part of the stopper layer is exposed.

Preferably, during the first and the second etching process, an internal pressure of the processing vessel is maintained within a range between 13.3 and 66.7 Pa (100 and 500 mTorr) and a high frequency power applied for generating the plasma is set to be within a range between 1.6 and 7.6 W/cm² on the object to the processed.

Preferably, a ratio of HBr to the sum of the fluorine-containing gas and $O_2$ (HBr/(fluorine-containing gas+$O_2$)) contained in the second etching gas is set to be in a range between 0.25 and 1 exclusive.

Preferably, the stopper layer is a silicon oxide film and the object to be processed is a silicon wafer having an SOI structure.

In accordance with a second aspect of the present invention, there is provided an etching method for performing an etching with a plasma of an etching gas acting on an object to be processed loaded in an evacuable processing vessel, wherein the object has a mask layer of a predetermined pattern, a layer to be etched formed below the mask layer and a stopper layer formed below the layer to be etched, the method including: a first etching process for forming an opening with a tapered wall surface in the layer to be etched; and a second etching process for expanding the tapered wall surface of the opening in horizontal direction and concurrently elongating the opening vertically such that the opening has a substantially vertical profile extending to the stopper layer.

Preferably, in the first etching process, etching is performed until a part of the stopper layer is exposed.

Preferably, an etching rate of the second etching process is smaller than that of the first etching process.

In accordance with a third aspect of the present invention, there is provided a computer readable storage medium for storing therein a control program executable in a computer, wherein, when executed, the control program controls a plasma etching apparatus for use in performing an etching method for etching an object to be processed for forming an opening with a substantially vertical profile extending to a stopper layer with a plasma of an etching gas acting on the object to be processed, wherein the object to be processed has a mask layer of a predetermined pattern, a silicon layer to be etched formed below the mask layer and the stopper layer formed below the silicon layer, the method including: a first etching process for forming an opening with a tapered wall surface in the silicon layer by using a first etching gas including a fluorine-containing gas and $O_2$ but not HBr; and a second etching process for etching the opening by using a second etching gas including a fluorine-containing gas, $O_2$ and HBr.

Preferably, the fluorine-containing gas is $SF_6$. Further, in the first etching process, the etching may be performed until a part of the stopper layer is exposed or overetching may be performed for a preset time period after a part of the stopper layer is exposed.

Preferably, during the first and the second etching process, an internal pressure of a processing vessel is maintained in a range between 13.3 and 66.7 Pa (100 and 500 mTorr) and a high frequency power for generating the plasma is set to be within a range between 1.6 and 7.6 $W/cm^2$ on the object to the processed.

Preferably, a ratio of HBr to the sum of the fluorine-containing gas and $O_2$ (HBr/(fluorine-containing gas+$O_2$)) contained in the second etching gas is determined between 0.25 and 1 exclusive.

Preferably, the stopper layer is a silicon oxide film and the object to be processed is a silicon wafer having an SOI structure.

In accordance with a fourth aspect of the present invention, there is provided a computer readable storage medium for storing therein a control program executable in a computer, wherein, when executed, the control program controls a plasma etching apparatus for use in performing an etching method for etching an object to be processed loaded in an evacuable processing vessel with a plasma of an etching gas acting on the object to be processed, wherein the object to be processed has a mask layer of a predetermined pattern, a silicon layer to be etched formed below the mask layer and a stopper layer formed below the silicon layer, the method including: a first etching process for forming an opening with a tapered wall surface in the silicon layer; and a second etching process for expanding the tapered wall surface of the opening in horizontal direction and concurrently elongating the opening vertically such that the opening has a substantially vertical profile extending to the stopper layer.

Preferably, in the first etching process, etching is performed until a part of the stopper layer is exposed. Further, Preferably, an etching rate of the second etching process is smaller than that of the first etching process.

In accordance with the etching method of the present invention, which includes at least two steps of a first etching process for forming a hole or trench with a tapered wall surface in the silicon layer by using a first etching gas including a fluorine-containing gas and $O_2$ and a second etching process for etching the hole or the trench to have a substantially vertical wall surface by using a second etching gas including a fluorine-containing gas, $O_2$ and HBr, it is possible to maintain the etching processes at a high etching rate, while avoiding notching effectively.

BRIEF DESCRIPTION OF THE DRAWINGS

The above and other objects and features of the present invention will become apparent from the following description of preferred embodiments given in conjunction with the accompanying drawings, in which:

FIG. 4A illustrates a state prior to performing an etching and FIGS. 4B and 4C show states after performing a first and a second etching process, respectively;

DETAILED DESCRIPTION OF THE PREFERRED EMBODIMENTS

Figure 1:
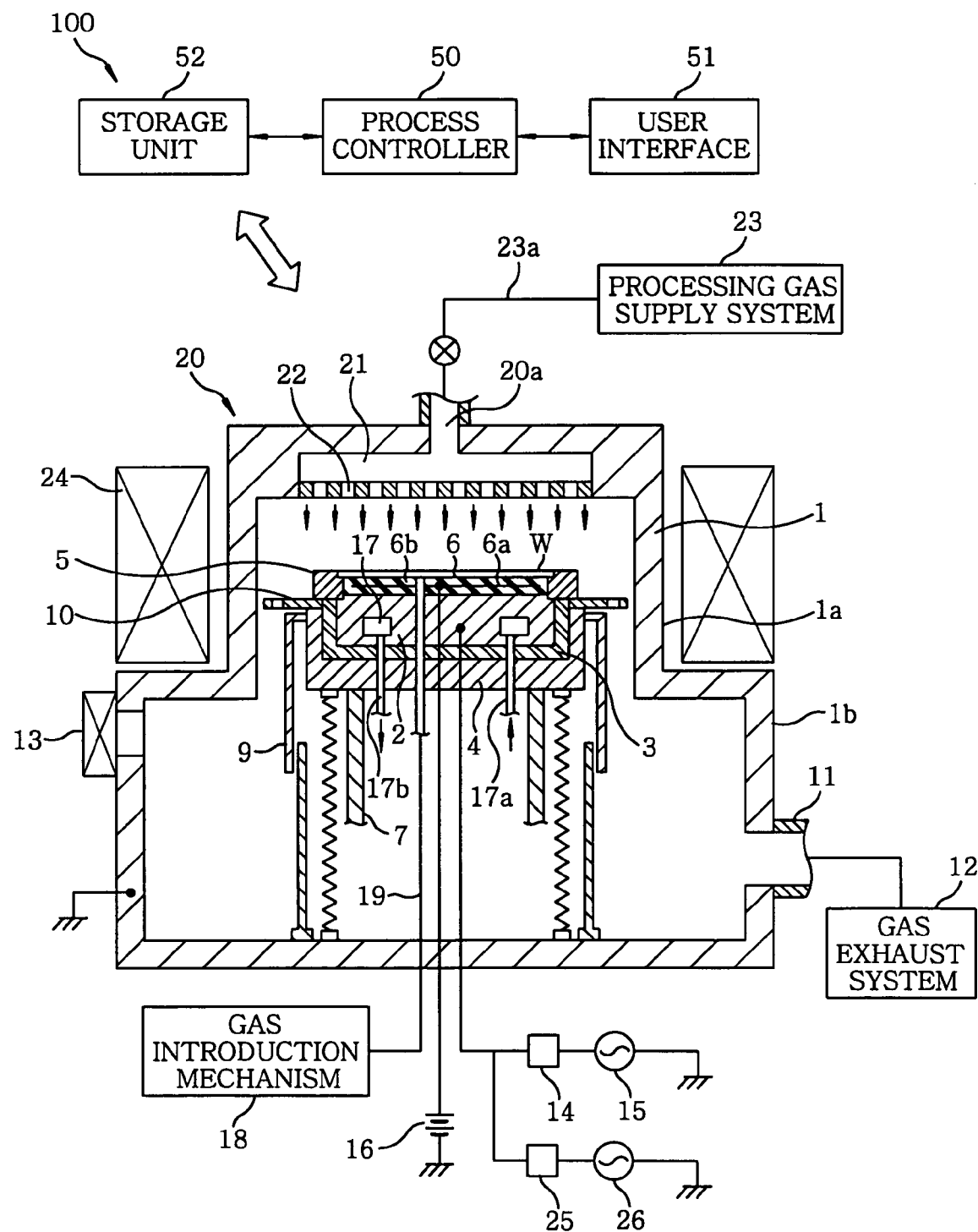
FIG. 1 provides a cross sectional view to illustrate a schematic configuration of a magnetron RIE plasma etching apparatus for performing an etching method in accordance with the present invention.

Hereinafter, preferred embodiments of the present invention will be described in detail with reference to the accompanying drawings. FIG. 1 schematically illustrates a configuration of a magnetron RIE plasma processing apparatus 100 for employing an etching method in accordance with the present invention. The etching apparatus 100 is hermetically sealed and is configured to have a stepped cylindrical shape with an upper portion 1a of a smaller diameter and a lower portion 1b of a larger diameter. Further, the apparatus 100 has a chamber (processing vessel) 1 whose wall is formed of, for example, aluminum.

Installed in the chamber 1 is a supporting table 2 for horizontally supporting a wafer W that is a silicon (Si) substrate with an SOI structure. The supporting table 2 is formed of, for example, aluminum and is supported by a conductive support 4 via an insulator 3. Furthermore, a focus ring 5 formed of a material other than Si, for example, quartz, is mounted on the periphery of the top surface of the supporting table 2. The supporting table 2 and the support 4 are moved upward and downward by a ball screw mechanism including ball screws 7, and a driving portion below the support 4 is covered with a bellows 8 formed of stainless steel (SUS). Further, a bellows cover 9 is installed to surround the bellows 8. Also, a baffle plate 10 is installed outside the focus ring 5, and the focus ring 5 is electrically connected to the chamber 1 via the baffle plate 10, the support 4 and the bellows 8. The chamber 1 is grounded.

A gas outlet port 11 is formed in a sidewall of the lower portion 1b of the chamber 1, and a gas exhaust system 12 is connected to the gas outlet port 11. By operating a vacuum pump of the gas exhaust system 12, the chamber 1 can be depressurized to a predetermined vacuum level. Further, a gate valve 13 for opening and closing a loading/unloading port for the wafer w is installed at an upper sidewall of the lower portion 1*b* of the chamber 1.

A first high frequency power supply 15 for generating a plasma is connected to the supporting table 2 via a matching unit 14 such that a high frequency power of a predetermined frequency is applied to the supporting table 2 from the first high frequency power supply 15. Meanwhile, disposed above the supporting table 2 to face it in parallel is a shower head 20 to be described later in detail. The shower head 20 is grounded. Thus, the supporting table 2 and the shower head 20 function as a pair of electrodes.

A second high frequency power supply 26 is connected to a power feed line of the first high frequency power supply 15 via a matching unit 25. The second high frequency power supply 26 applies a high frequency power of a frequency lower than that from the first high frequency power supply 15, so that it is superposed upon the high frequency power for the plasma generation.

An electrostatic chuck 6 for electrostatically attracting and holding a wafer W thereon is mounted on a top surface of the supporting table 2. The electrostatic chuck 6 has an electrode 6*a* embedded in an insulator 6*b*, and the electrode 6*a* is connected to a DC power supply 16. By applying a voltage to the electrode 6*a* from the DC power supply 16, the wafer W is attracted and held by the electrostatic chuck 6 by the help of the electrostatic force, i.e., a Coulomb force.

A coolant path 17 is formed within the supporting table 2. A coolant is introduced into the coolant path 17 via a coolant introducing line 17*a* and is discharged via a coolant discharge line 17*b*. By the circulation of the coolant, a heat transfer between the wafer W and the coolant is carried out via the supporting table 2, whereby a to-be-processed surface of the wafer W is maintained at a desired temperature level.

Further, even while the chamber 1 is evacuated by the gas exhaust system 12 and is maintained in a vacuum state, a heat transfer gas is introduced between the top surface of the electrostatic chuck 6 and the rear surface of the wafer W at a preset back pressure from a gas introduction mechanism 18 via a gas supply line 19, to facilitate the cooling of the wafer W by the coolant which is circulated through the coolant path 17. By introducing the heat transfer gas, the heat transfer between the wafer W and the coolant can be efficiently carried out, so that the cooling efficiency for the wafer W can be improved.

The shower head 20 is disposed at a ceiling portion of the chamber 2 to face the supporting table 2. The shower head 20 is provided with a plurality of gas discharge openings 22 on its lower surface and has a gas inlet 20*a* in an upper portion thereof. Further, the shower head 20 has a hollow space 21 formed therein. A gas supply line 23*a* is connected at one end to the gas inlet 20*a*, and the other end of the gas supply line 23*a* is coupled to a processing gas supply system 23 for supplying a processing gas containing an etching gas and a dilution gas.

The processing gas is introduced into the space 21 of the shower head 20 from the processing gas supply system 23 via the gas supply line 23*a* and the gas inlet 20*a*, and is sprayed toward the wafer W through the gas discharge openings 22.

Figure 2:
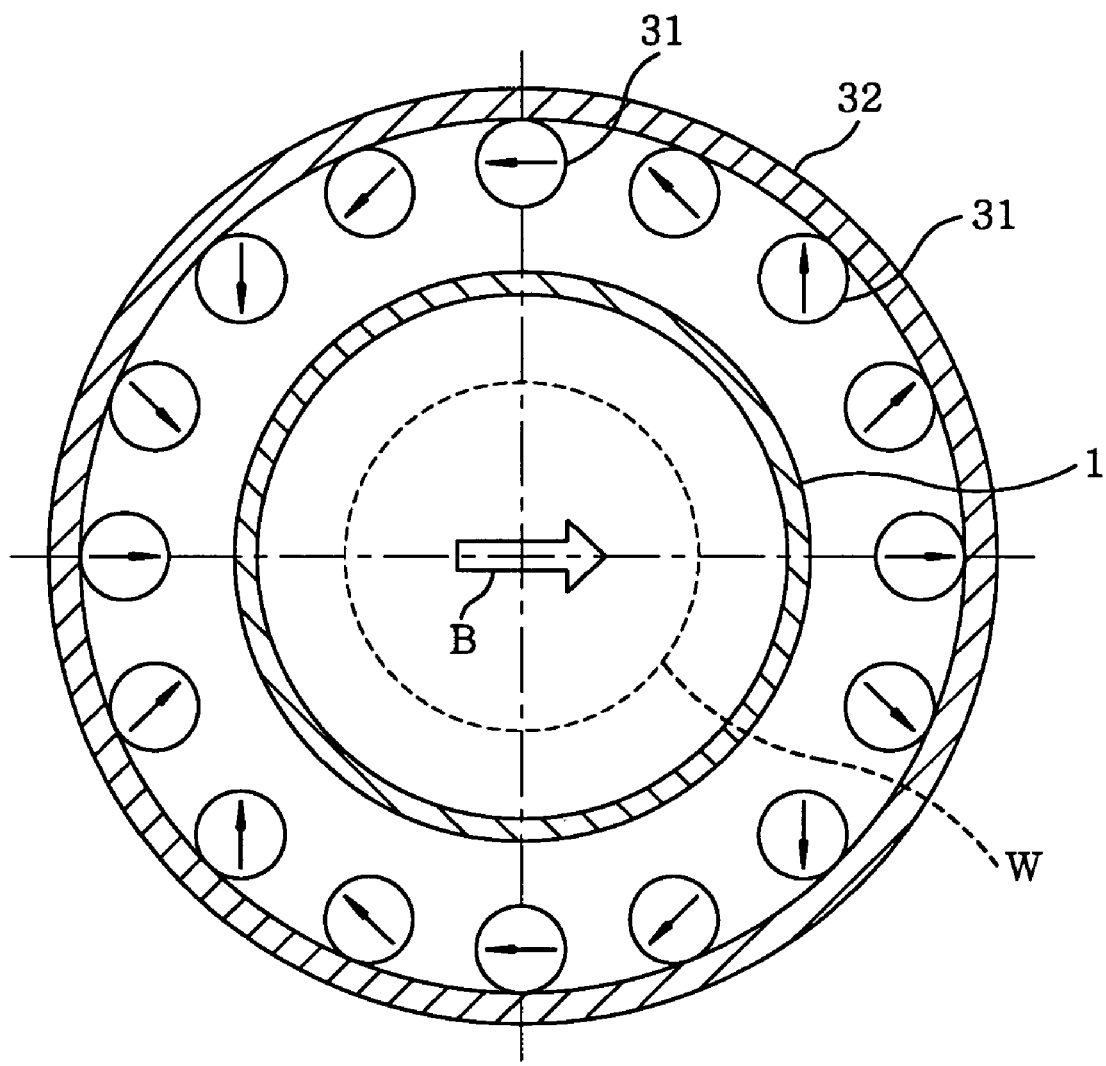
FIG. 2 sets forth a schematic horizontal cross sectional view of a dipole ring magnet disposed around a processing chamber of the apparatus shown in FIG. 1.

Further, a dipole ring magnet 24 is concentrically disposed around the upper portion 1*a* of the chamber 1. As shown in a horizontal cross sectional view of FIG. 2, the dipole ring magnet 24 has a plurality of columnar anisotropic segment magnets 31 installed in a casing 32 of a ring-shaped magnetic body. In this embodiment, 16 columnar anisotropic segment magnets 31 are annularly arranged. In FIG. 2, the arrows in the magnets 31 represent magnetization directions, and, as shown in the figure, by arranging each of the magnetization directions of the plurality of columnar anisotropic segment magnets 31 to slightly deviate from those of their neighboring magnets, a resultant uniform horizontal magnetic field B is formed along a single direction as a whole.

Figure 3:
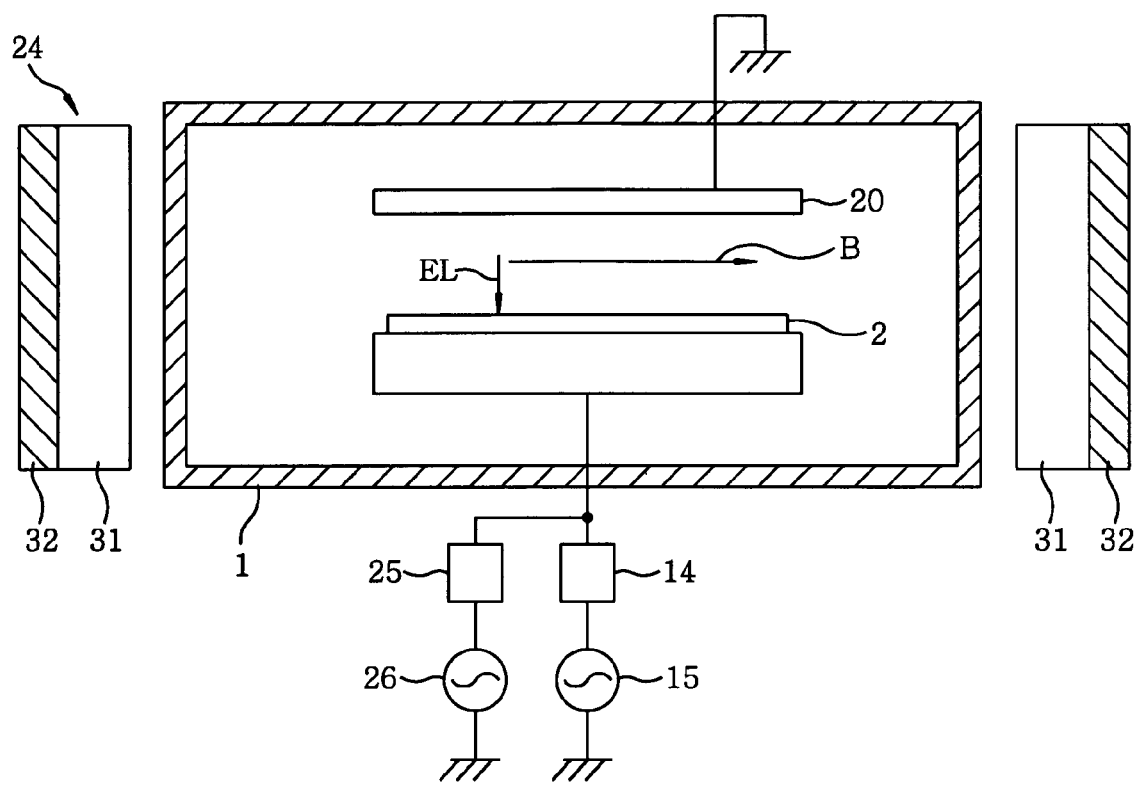
FIG. 3 depicts a schematic view to explain an electric field and a magnetic field formed in the processing chamber.

Accordingly, in a space between the supporting table 2 and the shower head 20, a vertical electric field EL is formed due to an electric power supplied from the first high frequency power supply 15 and the horizontal magnetic field B is formed by the dipole ring magnet 24, as shown in FIG. 3. Thus, by the orthogonal electromagnetic field thus formed, a magnetron discharge is generated, and, as a result, a high-energy plasma of an etching gas is generated, with which the wafer W is etched.

Each component of the plasma etching apparatus 100 is connected to and controlled by a process controller 50 with a CPU. A process manager can operate the plasma etching apparatus 100 by using a user interface 51 connected to the process controller 50, wherein the user interface 51 includes a keyboard for inputting a command, a display for showing an operational status of the plasma etching apparatus 100, and the like.

Moreover, also connected to the processing controller 50 is a memory unit 52 for storing therein a recipe including a control program, processing condition data and the like to be used in realizing various processings performed in the plasma etching apparatus 100 under the control of the process controller 50.

Further, when a command is received from the user interface 51, the process controller 50 retrieves a necessary recipe from the memory unit 52 to execute it, so that a desired processing is performed in the plasma processing apparatus 100 under the control of the process controller 50. Moreover, the necessary recipe can be retrieved from a readable storage medium such as a CD-ROM, a hard disk, a flexible disk or the like, or retrieved on-line through, for example, a dedicated line to another apparatus available all the time.

Hereinafter, an etching method in accordance with a preferred embodiment of the present invention, which is performed by the plasma etching apparatus 100 configured as described above, will be described with reference to FIGS. 4A to 4C. In the etching method of the present invention, since the etching is performed in two steps including a first and a second etching processing step, following descriptions will be provided for the first and the second etching process, respectively.

First Etching Process

Figure 4A:
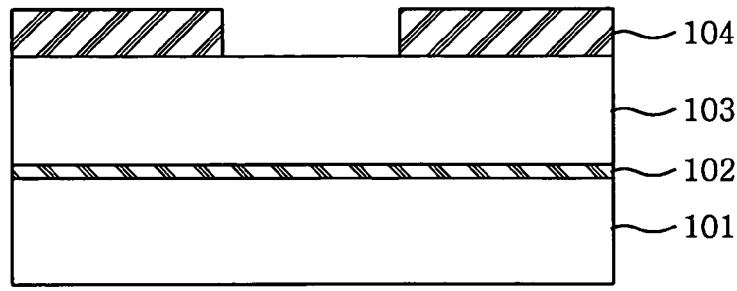
FIGS. 4A to 4C describe a sequence of the etching method in accordance with the present invention.

In the first etching process, the gate valve 13 shown in FIG. 1 is opened first, and a wafer W is loaded into the chamber 1 to be mounted on the supporting table 2. Then, the supporting table 2 is elevated up to a position illustrated in the figure, and the chamber 1 is evacuated via the gas outlet port 11 by the vacuum pump of the gas exhaust system 12. As shown in FIG. 4A, on a Si substrate 101, a stopper layer 102 of insulating oxide, a silicon (Si) layer 103 to be etched (e.g., polysilicon) and a mask layer 104 such as resist are laminated in this order. The mask layer 104 has a predetermined pattern.

A processing gas including an etching gas and a dilution gas is supplied into the chamber 1 from the processing gas supply system 23 at a preset flow rate. Then, while the internal pressure of the chamber 1 is controlled to be kept within a range between 13.3 and 66.7 Pa (between 100 and 500 mTorr), a predetermined high frequency power is applied to the supporting table 2 from the first high frequency power supply 15. It is preferred that the high frequency power for generating the plasma is set to be within a range between, e.g., 1.6 and 7.6 W/cm$^2$ on the wafer W. At this time, by a preset voltage applied to the electrode 6a of the electrostatic chuck 6 from the DC power supply 16, the wafer W is attracted and held by the electrostatic chuck 6 due to, for example, a Coulomb force, and, at the same time, a high frequency electric field is formed between the shower head 20 serving as an upper electrode and a supporting table 2 serving as a lower electrode. Since the horizontal magnetic field B is also formed between the shower head 20 and the supporting table 2 due to the presence of the dipole ring magnet 24, an orthogonal electromagnetic field is formed in the processing space between the upper and the lower electrode where the wafer W is located. The orthogonal electromagnetic field makes electrons produced drift, which in turn generates a magnetron discharge. Then, the wafer W is etched by the plasma of the etching gas generated due to the magnetron discharge. Here, by setting the gas pressure within the chamber 1 high, a sufficient amount of radicals can be generated as well as charged particles including ions and electrons, so that a high-rate etching of 20 μm/min or greater can be realized by the help of the effective action of the radicals.

Moreover, to increase the number of radicals present above the wafer W, it is preferable to apply a high frequency power to the electrode on which the wafer W is mounted. In the preferred embodiment of the present invention, since a high frequency power is applied to the supporting table 2 serving as the lower electrode on which the wafer W is mounted by using an RIE type plasma generating mechanism, the plasma can be generated right above the object to be processed. Accordingly, the extinguishment rate of the radicals decreases, thus resulting in an increase in the number of radicals right above the wafer W to facilitate the contribution of the radicals to the etching of the wafer W. Furthermore, the etching is performed while the magnetic field orthogonal to the electric field between the electrodes is formed, so that an E×B drift occurs immediately above the object to be processed. As a result, a high plasma density can be realized right above the object to be processed. Accordingly, the etching can be performed at a higher rate due to the synergy effects with the high gas pressure.

To increase the etching rate of the wafer W, the etching gas for use in the first etching process preferably includes a gas containing fluorine that features high reactivity and a gas containing oxygen. As for the fluorine-containing gas, its reactivity improves as the number of fluorine atoms (F) per a single molecule increases. If the molecule of the fluorine-containing gas is written as $A_xF_y$ (A represents an arbitrary element, and x and y represent valence), it is preferable that y is a value of 4 or larger and, more preferably, a value of 6 or larger for achieving high reactivity. Such fluorine-containing gas includes $CF_4$, $C_3F_8$, $SF_6$, $S_2F_{10}$ and the like. Further, by using oxygen gas together with the fluorine-containing gas, etching anisotrophy, i.e., etching profile can be improved. Specifically, it is preferable to use an etching gas containing $SF_6$ and $O_2$ whose ratio of $SF_6/O_2$ ranges from 1 to 10, more preferably from 3 to 4, for achieving a high etching rate and improving the etching profile.

In improving the etching profile, it is also effective to keep the temperature of the wafer W low. For the reason, there is provided the coolant path 17 through which a coolant is circulated. With this configuration, heat can be transferred between the coolant and the wafer W via the supporting table, whereby the to-be-processed surface of the wafer W can be controlled to be kept at a desired temperature. To improve the etching profile, i.e., etching anisotrophy, a coolant of, e.g., about −30° C. is circulated.

Moreover, a heat transfer gas for effectively transferring the heat between the coolant and the wafer W is introduced between the top surface of the electrostatic chuck 6 and the rear surface of the wafer W at a preset pressure (back pressure) from the gas introduction mechanism 18 via the gas supply line 19. As the heat transfer gas, it is preferable to employ a gas used as an etching gas such as $SF_6$ or $C_4F_8$ in lieu of a typical He gas. Since respective cooling efficiencies of those gases are better than that of the He gas, the efficiency of cooing the wafer W can be further improved and the etching profile can be improved as well.

The frequency and the output of the first high frequency power supply 15 for generating plasma is properly adjusted to be set to optimally generate a desired plasma. To increase the plasma density immediately above the wafer W, its frequency is preferably set to be not smaller than 27 MHz.

The second high frequency power supply 26 is for supplying a high frequency power to control the ion energy of the plasma. Preferably, the frequency of the second high frequency power supply 26 is set to be smaller than the frequency of the first high frequency power supply 15 but not smaller than 2 MHz.

The dipole ring magnet 24 provides the magnetic field in the processing space between the supporting table 2 and the shower head 20 serving as the oppositely facing electrodes, respectively, in order to increase the plasma density right above the wafer W. To be effective in increasing the plasma density, the dipole ring magnet 24 needs to have a strength capable of providing a magnetic field of 10000 μT (100 G) or greater. Though it is believed that a stronger magnetic field generates a higher plasma density, it is preferred that the magnetic field is not greater than 100000 μT (1 kG) for safety.

Figure 4B:
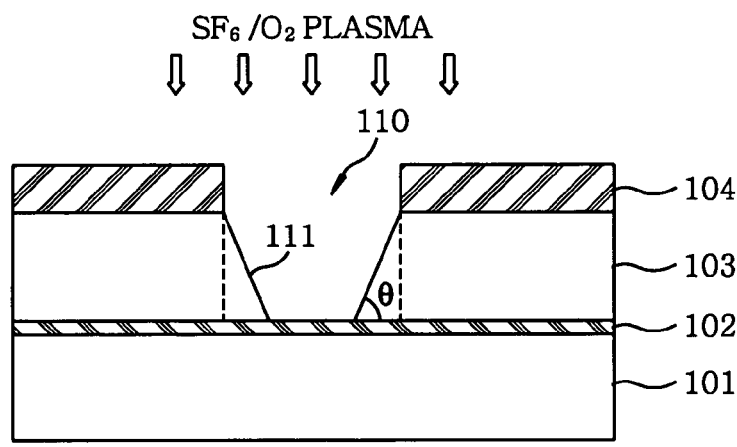
Figure 4C:
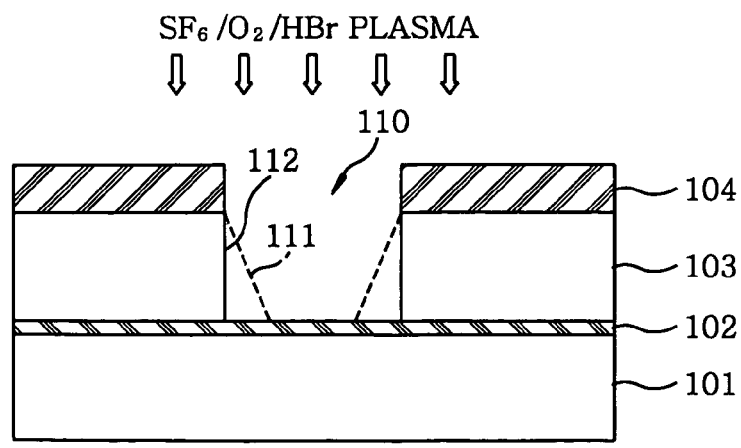

Referring to FIG. 4B, in the first etching process, etching is performed starting from the mask layer 104 toward the Si layer 103 such that a sidewall 111 of a hole (or trench) 110 is tapered. That is, with respect to a final etching profile shown by a broken line in FIG. 4B, the etching of the lower sidewall 111 of the hole (or trench) 110 is restrained. The angle θ of the tapered sidewall 111 is preferably controlled to be in a range of 80° to 88° with respect to the stopper layer 102 serving as a bottom surface.

The taper shape can be adjusted by controlling the internal pressure of the chamber 1 and the high frequency power for generating the plasma in the first etching process. For the purpose, in the first etching process, the internal pressure of the chamber 1 is set to range from 13.3 to 66.7 Pa (100 to 500 mTorr) and the high frequency power for plasma generation is set to range from 1.6 to 7.6 W/cm$^2$ on the wafer W.

Figure 5:
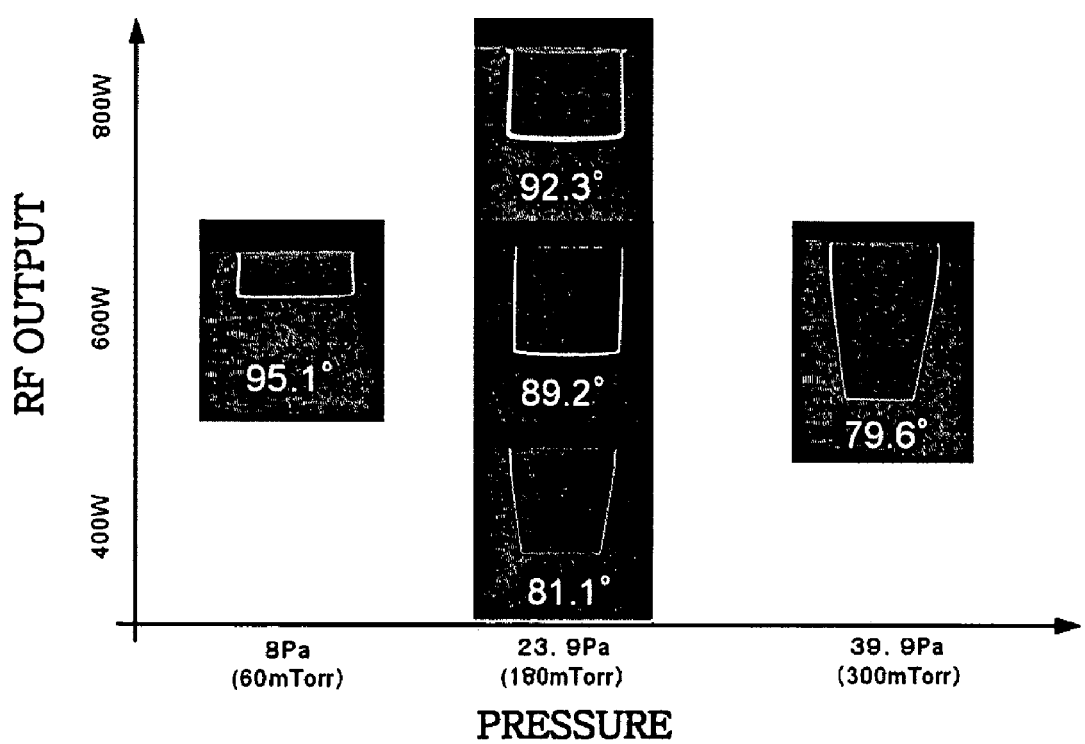
FIG. 5 shows an electron micrograph of etching profiles to explain influences of a pressure and a high frequency power upon a taper angle of etching.

There will now be described a simulation conducted to investigate the influences of the pressure and the high frequency power upon the taper shape of the hole 110. FIG. 5 shows vertical cross-sectional profiles of square holes 110 having a size of 40×40 μm formed at a central portion of the wafer W by varying the internal pressure of the chamber 1 from 8 to 39.9 Pa (60 to 300 mTorr) and the high frequency power from 400 to 800 W (2.2 to 4.4 W/cm$^2$ on wafer W), wherein the micrographs were obtained through an electron microscope. Further, other conditions for the plasma etching are as follows.

Conditions for the Plasma Etching:
strength of magnetic field=17000 μT (170 G) gradient magnets;
flow rate ratio of $SF_6/O_2$=300/80;

distance between the upper and the lower electrode (distance between the bottom surface of the shower head 20 and the top surface of the supporting table 2: this is same hereinafter)=37 mm;
back pressure (center/edge)=933/5332 Pa (7/40 Torr);
temperature of shower head 20=40° C.;
temperature of sidewall of chamber 1=40° C.;
temperature of supporting table 2=−10° C.

In FIG. 5, taper angles are specified by white-colored numerals. As can be seen from FIG. 5, as the internal pressure of the chamber increases, taper angle θ decreases and tapering tendency becomes stronger. Further, if the high frequency power increases under a same internal pressure of the chamber, the taper angle θ increases and the tapering tendency becomes weak (or the profiles are found to be tapered in reverse direction).

The above experiment proves that etching can be performed to form a hole 110 of a tapered profile by way of controlling the internal pressure of the chamber and the high frequency power while using the processing gas including $SF_6$ and $O_2$.

As shown in FIG. 4B, the first etching process may be terminated when a part of the stopper layer 102 is exposed or after performing an overetching for a predetermined time period even after a part of the stopper layer 102 is exposed. To be specific, the overetching is preferably performed for a time period that allows an excessive etching by, for example, 0 to 15% of the film thickness to be etched.

Second Etching Process

A second etching process is performed by using the plasma etching apparatus 100 after changing a processing gas. As can be seen from FIG. 4C, the second etching is performed to expand the tapered sidewall 111 (indicated by the broken line) of the hole 110, which has been formed through the first etching process, in horizontal direction.

A gas including, for example, a fluorine-containing gas such as $SF_6$, $O_2$ gas and HBr gas is used as a processing gas for the second etching process. The same fluorine-containing gas as employed in the first etching process may be used.

Figure 6:
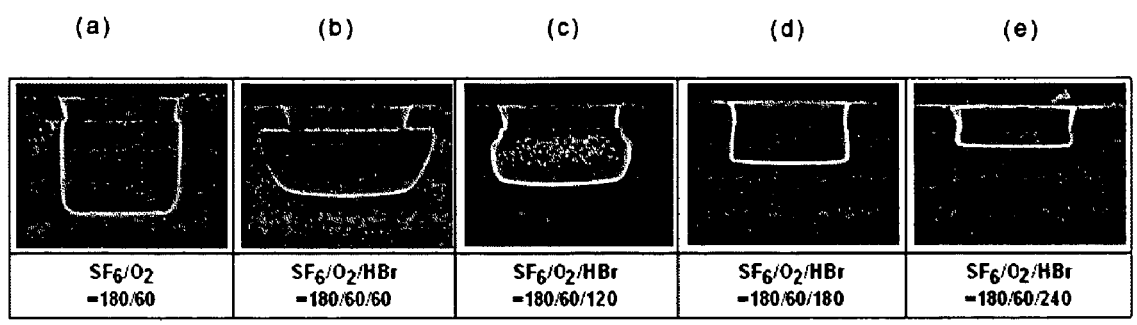
FIG. 6 sets forth a series of electron micrographs of etching profiles obtained by varying a ratio of addition of HBr.

Here, FIG. 6 shows electron micrographs of profiles of holes 110 obtained by performing an etching on a Si substrate in cases (a) to (e) where flow rate ratios of the HBr gas, the $SF_6$ and the $O_2$ gas contained in the etching gas are varied, which were photographed by using an electron microscope.

In this experiment, the flow rate of $SF_6/O_2$ was fixed at 180/60 mL/min, while the flow rate of HBr was varied. In cases (a) to (e) of FIG. 6, the flow rates of HBr gases are set to be 0 mL/min, 60 mL/min, 120 mL/min, 180 mL/min and 240 mL/min, respectively, and the ratios of HBr/($SF_6+O_2$) gases are set to be 0, 0.25, 0.5, 0.75 and 1, respectively.

Further, other conditions for the plasma etching are as follows.

Conditions for the Plasma Etching:
strength of magnetic field=17000 μT (170 G) gradient magnet;
internal pressure of chamber 1=26.7 Pa (200 mTorr);
high frequency power=600 W (3.3 W/cm² on wafer);
distance between the upper and the lower electrode=37 mm;
back pressure (center/edge)=1333/2666 Pa (10/20 Torr);
temperature of shower head 20=40° C.;
temperature of sidewall of chamber 1=40° C.;
temperature of supporting table 2=0° C.

From the cases (a) to (e) of FIG. 6, it has been found that etching rates and the depths of the holes 110 decrease as the amount of HBr increases. It is because HBr creates deposits during the etching and the deposits serve as protection films, thus reducing the etching rate. However, when the processing gas contains no HBr gas as in the case (a) of FIG. 6, there is no protection by the deposits, so that etching is done in vertical direction, which causes notching in an SOI wafer having a stopper layer 102. Moreover, in case the flow rate of HBr is small as in the case (b) of FIG. 6, the hole 110 tends to be expanded in horizontal direction excessively. Thus, it is understood that there exits an optimum range for the ratio of gas flow rates to etch a tapered sidewall 111 substantially vertically in the second etching process though it depends on other conditions as well.

From the above experiment, one can conclude that it is preferable to perform the second etching process by setting the ratio of HBr to the sum of the fluorine-containing gas and $O_2$ (HBr/(fluorine-containing gas+$O_2$)) in the range between 0.25 and 1 exclusive, which covers the cases (c) and (d) of FIG. 6. Also, to suppress the reduction in the etching rate, it is more preferable to set the ratio to range from 0.25 to 0.75 exclusive; and, most preferably, the ratio is set to be greater than 0.25 and equal to or less than 0.5.

Further, to prevent notching and control etching profiles, the internal pressure of the chamber 1 is preferably set to range from 26.7 to 66.7 Pa (200~500 mTorr) and the high frequency power for generating plasma is preferably set to range from 1.6 to 3.3 W/cm² on the wafer W in the second etching process.

Moreover, in the second etching process, taper angles are detected by means of an etching profile monitoring device using an optical mechanism, and the etching may be terminated at a point when a desired etching profile is obtained.

Based on the above-described experimental examinations, etching was performed by using the plasma etching apparatus 100, and the results are provided in FIGS. 7A to 9B. In the figures, a "central portion" represents a hole 110 formed in the center of an SOI wafer while an "edge portion" indicates a hole 110 formed in an edge of the SOI wafer.

Figure 7A:
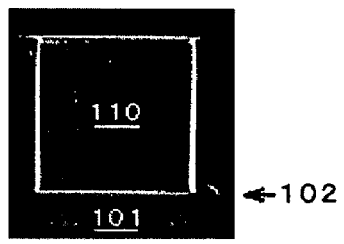
FIGS. 7A to 7D illustrate electron micrographs of etching profiles in accordance with comparative examples.
Figure 7B:
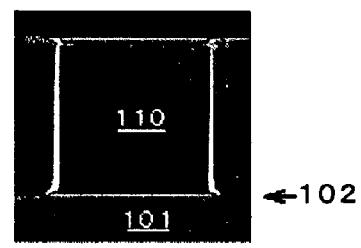
Figure 7C:
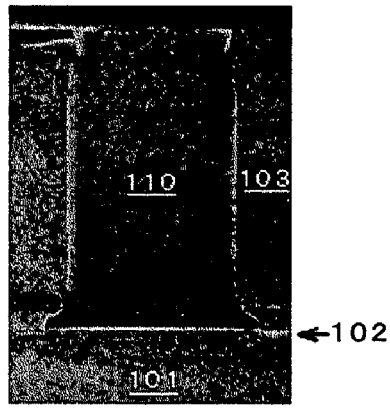
Figure 7D:
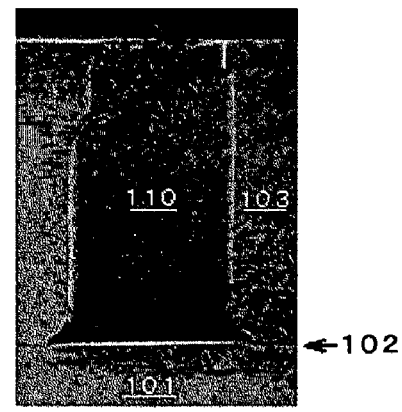

FIGS. 7A to 7D provide comparative examples, wherein FIGS. 7A and 7B are electron micrographs of cross sections of holes 110 obtained by performing a single-step etching on samples whose silicon layers 103 had a film thickness of 50 μm, while FIGS. 7C and 7D are electron micrographs of cross sections of holes 110 obtained by performing a single-step etching on samples whose silicon layers 103 having a film thickness of 100 μm.

(1) Conditions for the Etching:
strength of magnetic field=17000 μT (170 G);
internal pressure of chamber 1=26.7 Pa (200 mTorr);
high frequency power=600 W (3.3 W/cm² on wafer);
flow rate ratio of $SF_6/O_2$=180/60;
distance between the upper and the lower electrode=37 mm;
back pressure (center/edge)=1333/2666 Pa (10/20 Torr);
temperature of shower head 20=40° C.;
temperature of sidewall of chamber 1=40° C.;
temperature of supporting table 2=0° C.

For the samples in FIGS. 7A and 7B of the silicon layers 103 of a film thickness of 50 μM, etching was performed for a time period needed for performing a 30% overetching, that is, down to a depth of 65 μm. Further, for the samples in FIGS. 7C and 7D of the silicon layers 103 of a film thickness of 100 μm, etching was performed for a time period needed for performing a 15% overetching, that is, down to a depth of 115 μm.

Referring to FIGS. 7A to 7D, in every sample, it has been found that the bottom portion of the hole 110 was etched along the stopper layer 102, suffering from notching.

Figure 8A:
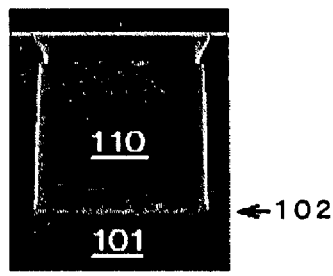
FIGS. 8A to 8D provide electron micrographs of etching profiles in accordance with a first preferred embodiment of the present invention.
Figure 8B:
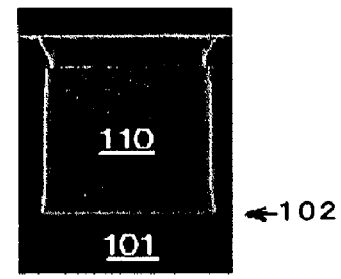
Figure 8C:
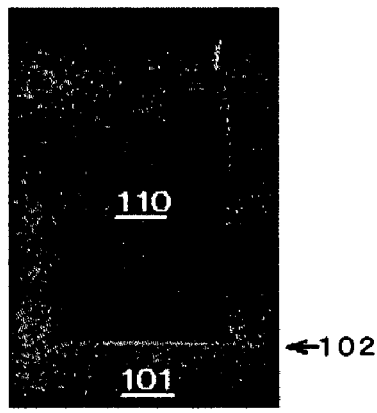
Figure 8D:
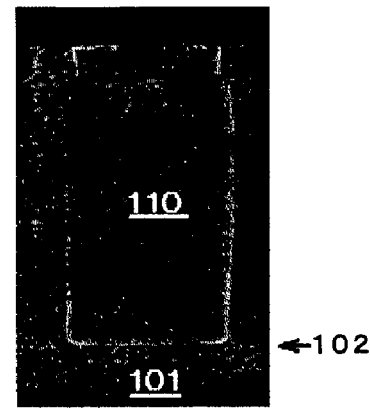

FIGS. 8A to 8D show results obtained by employing the first preferred embodiment in accordance with the present invention, wherein FIGS. 8A and 8B are electron micrographs of cross sections of holes 110 obtained by performing a first and a second etching on samples of silicon layers 103 having film thicknesses of 50 μm, while FIGS. 8C and 8D are electron micrographs of cross sections of holes 110 obtained by performing a first and a second etching on samples of silicon layers 103 having a film thickness of 100 μm.

(1) Conditions for the First Etching Process:
strength of magnetic field=17000 μT (170 G);
internal pressure of chamber 1=26.7 Pa (200 mTorr);
high frequency power=600 W (3.3 W/cm² on wafer);
flow rate ratio of $SF_6/O_2$=180/60;
distance between the upper and the lower electrode=37 mm;
back pressure (center/edge)=1333/2666 Pa (10/20 Torr);
temperature of shower head 20=40° C.;
temperature of sidewall of chamber 1=40° C.;
temperature of supporting table 2=0° C.

(2) Conditions for the Second Etching Process:
strength of magnetic field=17000 μT (170 G);
internal pressure of chamber 1=39.9 Pa (300 mTorr);
high frequency power=300 W (1.6 W/cm² on wafer);
flow rate ratio of $SF_6/O_2/HBr$=180/60/180;
distance between the upper and the lower electrode=37 mm;
back pressure (center/edge)=1333/2666 Pa (10/20 Torr);
temperature of shower head 20=40° C.;
temperature of sidewall of chamber 1=40° C.;
temperature of supporting table 2=0° C.

In the case of the sample in FIG. 8A, overetching was performed for a predetermined time period such that the total depth etched during the first and the second etching process amounts to 65 μm (45 μm in the first etching process plus 20 μm in the second etching process).

In the case of the sample in FIG. 8B, overetching was performed for a pre-specified time period such that the total depth etched during the first and the second etching process amounts to 57 μm (45 μm in the first etching process plus 12 μm in the second etching process).

In the case of the sample in FIG. 8C, overetching was performed for a predetermined time period such that the total depth etched during the first and the second etching process amounts to 115 μm (95 μm in the first etching process plus 20 μm in the second etching process).

In the case of the sample in FIG. 8D, overetching was performed for a pre-specified time period such that the total depth etched during the first and the second etching process amounts to 107 μm (95 μm in the first etching process plus 12 μm in the second etching process).

Referring to FIG. 8C that shows the cross section (film thickness of 100 μm) of the hole 110 at a central portion, though the bottom portion of the hole 110 was very slightly etched along the stopper layer 102 in horizontal direction, the significant notching as shown in FIGS. 7A to 7D was not observed. Further, as for the holes 110 in FIGS. 8A, 8B and 8D, no notching was observed occurring there.

Considering the results in FIGS. 7A to 7D and 8A to 8D together, in comparison with the case of the single-step etching processing performed for the same overall time period (FIGS. 7A to 7D), it has been found that occurrence of notching can be more effectively prevented by performing the two-step etching processing (FIGS. 8A to 8D) including the first etching process using a processing gas containing no HBr gas and the second etching process using a processing gas containing HBr gas at a predetermined flow rate ratio.

Figure 9A:
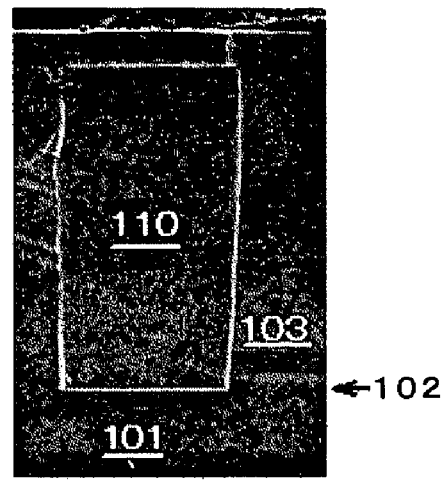
FIGS. 9A and 9B present electron micrographs of etching profiles in accordance with a second preferred embodiment of the present invention.
Figure 9B:
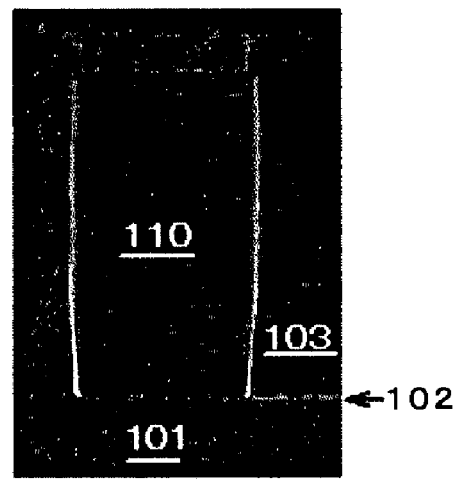

FIGS. 9A and 9B show results obtained by using the second preferred embodiment of the present invention, wherein FIGS. 9A and 9B are electron micrographs of cross sections of holes 110 obtained by performing a first and a second etching on samples of silicon layers 103 each having a film thickness of 100 μm.

(1) Conditions for the First Etching Process:
strength of magnetic field=17000 μT (170 G);
internal pressure of chamber 1=33.25 Pa (250 mTorr);
high frequency power=550 W (3.0 W/cm² on wafer);
flow rate ratio of $SF_6/O_2$=180/60;
distance between the upper and the lower electrode=37 mm;
back pressure (center/edge)=1333/2666 Pa (10/20 Torr);
temperature of shower head 20=40° C.;
temperature of sidewall of chamber 1=40° C.;
temperature of supporting table 2=0° C.

(2) Conditions for the Second Etching Process:
strength of magnetic field=17000 μT (170 G);
internal pressure of chamber 1=39.9 Pa (300 mTorr);
high frequency power=300 W (1.6 W/cm² on wafer);
flow rate ratio of $SF_6/O_2/HBr$=180/60/180;
distance between the upper and the lower electrode=37 mm;
back pressure (center/edge)=1333/2666 Pa (10/20 Torr);
temperature of shower head 20=40° C.;
temperature of sidewall of chamber 1=40° C.,;
temperature of supporting table 2=0° C.

Here, as for a central portion in FIG. 9A, etching was performed for a predetermined time period such that the total depth etched during the first and the second etching process amounts to 130 μm (115 μm in the first etching process plus 15 μm in the second etching process).

As for an edge portion in FIG. 9B, on the other hand, etching was performed for a pre-specified time period such that the total depth etched during the first and the second etching process amounts to 110 μm (101 μm in the first etching process plus 9 μm in the second etching process).

After the completion of the first etching process, the taper angle of the sidewall 111 of the hole 110 in the central portion was measured to be 83.7° (not shown) and after the second etching process, the taper angle of the sidewall 112 of the hole 110 was found to be 87.0°, so that the sidewall 112 of the hole 110 became almost vertical. Furthermore, as illustrated in FIGS. 9A and 9B, no notch was formed at any of the central portion and the edge portion.

Moreover, it was confirmed that in the second preferred embodiment, high etching rates were realized: 20 μm/min or greater in the first etching process and 5 to 10 μm/min in the second etching process.

As described above, it was proved that, by employing the etching method in accordance with the present invention, notching can be prevented and a wafer having, for instance, an SOI structure can be etched at a high etching rate. It was also proved that the etching profile can be improved.

Here, it is to be noted that the present invention is not limited to the preferred embodiments described above.

For example, though a dipole ring magnet is employed as a magnetic field forming device in the magnetron RIE plasma etching apparatus 100, other device may be employed instead of the dipole ring magnet, and the formation of the magnetic field is not essential. In addition, besides the magnetron RIE plasma processing apparatus, various plasma etching apparatuses including a capacitively coupled or an inductively coupled plasma etching apparatus can be used as long as they can generate plasma at a gas pressure in the range in accordance with the present invention. Here, to generate a plasma under a high pressure level, the capacitively coupled plasma etching apparatus is preferred to the inductively coupled plasma etching apparatus. Moreover, in order to have an object to be processed to be positioned closer to a plasma generation region, an RIE type is more preferable. Also, though the preferred embodiments have been described for the case of etching a wafer, the present invention may be applied any process as long as it etches Si of an object to be processed.

While the invention has been shown and described with respect to the preferred embodiments, it will be understood by those skilled in the art that various changes and modifications may be made without departing from the spirit and scope of the invention as defined in the following claims.

What is claimed is:

1. An etching method for performing an etching with a plasma of an etching gas acting on an object to be processed loaded in an evacuable processing vessel, wherein the object has a patterned mask layer, a layer to be etched formed below the mask layer and a stopper layer formed below the layer to be etched, the method comprising:

a first etching process for forming an opening with a tapered wall surface in the layer to be etched; and a second etching process for widening the opening and concurrently extending the opening vertically such that the opening has a substantially vertical profile extending to the stopper layer.

2. The method of claim 1, wherein, in the first etching process, etching is performed until a part of the stopper layer is exposed.

3. The method of claim 1, wherein an etching rate of the second etching process is smaller than that of the first etching process.

4. The method of claim 1, wherein the layer to be etched is a silicon layer; the first etching process is carried out by using a first etching gas including a fluorine-containing gas and $O_2$ but not HBr; and the second etching process is carried out by using a second etching gas including a fluorine containing gas, $O_2$ and HBr.

5. The method of claim 4, wherein the fluorine-containing gas is $SF_6$.

6. The method of claim 4, wherein, in the first etching process, the etching is performed until a part of the stopper layer is exposed.

7. The method of claim 1, wherein, in the first etching process, overetching is performed for a preset time period after a part of the stopper layer is exposed.

8. The method of claim 1, wherein during the first and the second etching process, an internal pressure of the processing vessel is maintained within a range between 13.3 and 66.7 Pa (100 and 500 mTorr) and a high frequency power applied for generating the plasma is set to be within a range between 1.6 and 7.6 $W/cm^2$ on the object to the processed.

9. The method of claim 4, wherein a ratio of HBr to the sum of the fluorine-containing gas and $O_2$ (HBr/(fluorine-containing gas +$O_2$)) contained in the second etching gas is set greater than 0.25 but less than 1.

10. The method of claim 1, wherein the stopper layer is a silicon oxide film and the object to be processed is a silicon wafer having an SOI structure.

* * * * *